United States Patent [19]

Fukushima

[11] 4,198,541
[45] Apr. 15, 1980

[54] SIGNAL HOLDING CIRCUIT

[75] Inventor: Isao Fukushima, Fujisawa, Japan

[73] Assignee: Hitachi, Ltd., Japan

[21] Appl. No.: 875,797

[22] Filed: Feb. 7, 1978

[30] Foreign Application Priority Data

Feb. 8, 1977 [JP] Japan .................. 52-12176

[51] Int. Cl.² ........................................... H03K 17/60
[52] U.S. Cl. .................... 179/1 P; 307/253; 455/312
[58] Field of Search ............ 179/1 P, 1 SW; 307/238, 307/239, 248, 251, 253; 325/348, 473, 475, 478, 480; 328/162, 165; 330/51

[56] References Cited

U.S. PATENT DOCUMENTS

| | | | |
|---|---|---|---|
| 3,401,359 | 9/1968 | Becker | 307/253 |
| 3,509,468 | 4/1970 | Overlie | 325/480 |
| 3,588,705 | 6/1971 | Paine | 325/480 |
| 3,659,120 | 4/1972 | Saeki | 307/253 |
| 3,952,252 | 4/1976 | Cornacchia | 179/1 P |
| 4,058,804 | 11/1977 | Sawada et al. | 325/478 |

Primary Examiner—Benedict V. Safourek
Attorney, Agent, or Firm—Craig & Antonelli

[57] ABSTRACT

A signal holding circuit is disclosed in which a parallel circuit of a constant current source circuit comprising a transistor having a constant voltage supplied to a base thereof and a hold capacitor is connected to an emitter follower transistor, a first control transistor is connected between a base of the emitter follower transistor and ground, a second control transistor is connected between the base of the transistor of the constant current source circuit and ground, and a control pulse corresponding in time to a duration of the pulsive noise is applied to the bases of the first and second control transistors to render the first and second control transistors conductive only during the application of the control pulse so that a charging time constant of the hold capacitor during the conduction of the emitter follower transistor is reduced and a discharging time constant of the hold capacitor during the cutoff of the emitter follower capacitor is increased.

16 Claims, 11 Drawing Figures

SIGNAL HOLDING CIRCUIT

LIST OF PRIOR ART REFERENCES (37 CFR 1.56 (a))

The following references are cited to show the state of the art:

U.S. Pat. No. 3,739,285 to Gerard Hepp, June 12, 1973.

U.S. Pat. No. 3,689,845 to Gerard Hepp, Sept. 5, 1972.

BACKGROUND OF THE INVENTION

1. FIELD OF THE INVENTION

The present invention relates to a signal holding circuit which, when a pulsive noise is included in a received signal of a receiver so that the pulsive noise is superimposed on an audio signal derived from a detection circuit of the receiver, holds a level of the audio signal during a period of superposition to a constant value at a moment immediately before the occurrence of the pulsive noise to suppress the pulsive noise.

2. DESCRIPTION OF THE PRIOR ART

A receiver, particularly a vehicle-mounted receiver is subjected to disturbance of signal reception by a pulsive noise which occurs by an internal combustion engine of an automobile or the like. U.S. Pat. Nos. 3,739,285 and 3,689,845 disclose circuits for suppressing such a pulsive noise. More particularly, in the circuits disclosed in those patents, a gate circuit including a gate transistor is provided between a detection circuit and an output circuit, a pulsive noise included in a received signal is detected by a pulsive noise detection circuit, the detected pulse is shaped by a pulse shaping circuit to produce a control pulse corresponding to a duration of the pulsive noise which control pulse is applied to a gate of the gate transistor e.g. a field effect transistor, of the gate circuit to cut off the source-drain of the gate transistor, and a hold capacitor is connected to the drain of the gate transistor so that when the control pulse is not applied and the gate transistor is conducting, an audio signal derived from the detection circuit and applied to the source is supplied to the hold capacitor and when the control pulse is applied and the gate transistor is cut off, the audio signal is discharged whereby a potential at the drain of the gate transistor, that is, a level of the audio signal is held at a level at a moment immediately before the occurrence of the pulsive noise.

In such a circuit where the control pulse is applied to the gate of the gate transistor to control the gate potential of the gate transistor for blocking the source-drain of the gate transistor to suppress the pulsive noise, there exists a drawback in that the gate control pulse appears at the drain or the output of the gate transistor through the gate-drain of the gate transistor. This is because, since the gate transistor is normally saturated during the reception of the signal, the gate transistor assumes an active condition even momentarily when the gate potential of the gate transistor is controlled to render itself non-conductive and the gate transistor acts as a source follower transistor during that period. A similar problem occurs when a bipolar transistor is used as the gate transistor. Accordingly, in that circuit, a compensation circuit means for eliminating the sprious control pulse is additionally required.

SUMMARY OF THE INVENTION

It is an object of the present invention to provide a signal holding circuit in which a control pulse for a gate transistor does not appear at an output electrode of the gate transistor and hence a compensation circuit means for eliminating the spurious pulse is not needed, so that a capacitance of a hold capacitor can be selected to a large value to establish desired charge and discharge time constants of the hold capacitor, and which can demodulate a received signal without distortion during normal reception of the signal and can fully suppress even a wide pulse noise when it is included in the received signal.

It is another object of the present invention to provide a signal holding circuit which may be applicable to a pulse suppressing circuit and a muting circuit.

In order to achieve the above objects, according to the present invention, an emitter follower transistor is used as the gate transistor and a parallel circuit of a constant current source circuit and a hold capacitor is connected to an emitter of the emitter follower transistor so that when a received signal such as an an audio signal on which a pulsive noise is superimposed is applied to a base of the emitter follower transistor, the transistor and the constant current source circuit are momentarily cut off to cut a discharge path for a charge stored in the hold capacitor.

According to the present invention, a charge time constant of the hold capacitor can be selected to be small enough to prevent the distortion of an input audio signal and a discharge time constant of the hold capacitor can be selected to be large enough to fully hold the signal without being bound by the charge time constant. Furthermore, no compensation circuit means for the control pulse is needed.

DESCRIPTION OF THE PREFERRED EMBODIMENTS

Figure 1:
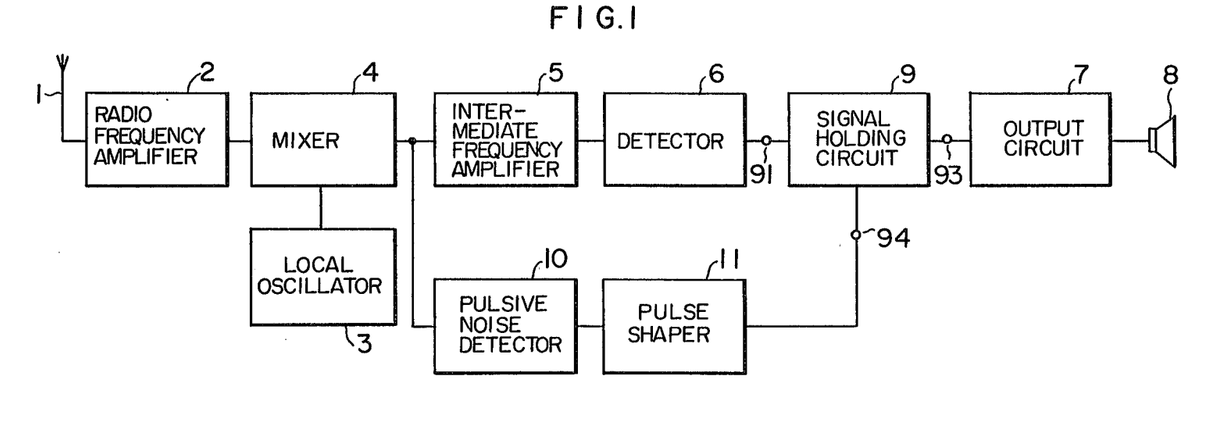
FIG. 1 shows a block diagram of one embodiment in which a signal holding circuit is used as a pulse suppression circuit.
Figure 2:
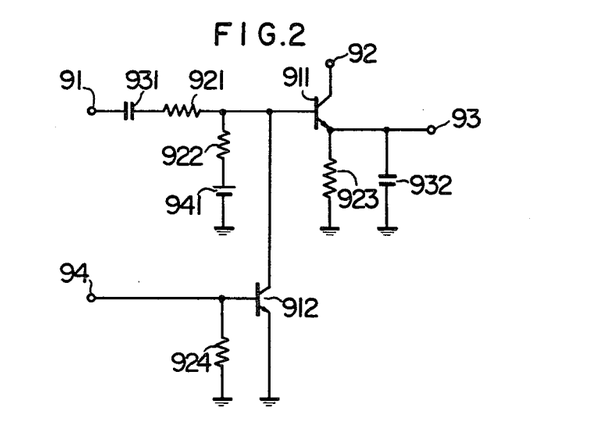
FIG. 2 shows a circuit diagram for illustrating a principle of a signal holding circuit of the present invention.
Figure 3:
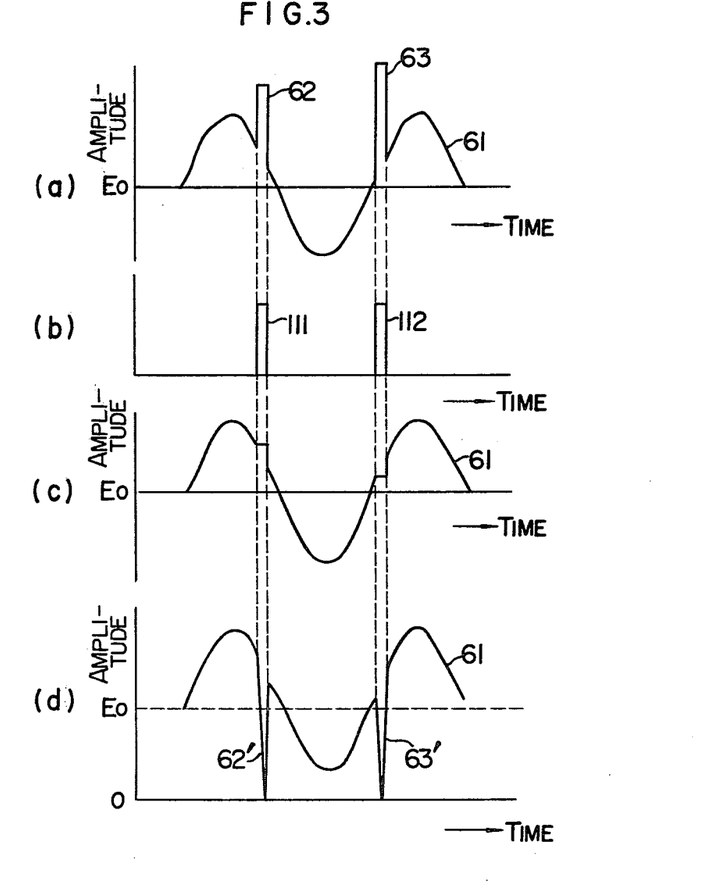
FIG. 3 shows waveforms for explaining the operation of the circuit of FIG. 2.

The signal holding circuit of the present invention is now explained. Referring first to FIGS. 1, 2 and 3, a principle of operation of the present invention is explained FIG. 1 shows an example in which the signal holding circuit is used as a pulse suppression circuit. In FIG. 1, numeral 1 denotes an antenna, 2 a radio frequency amplifier circuit, 3 a local oscillator circuit, 4 a mixer circuit, 5 an intermediate frequency amplifier circuit, 6 a detection circuit, 7 an output circuit, and 8 a speaker, all of which constitute a well-known superheterodyne receiver. Numeral 10 denotes a pulsive noise detecting circuit which detects a pulsive noise included in a received signal, at the intermediate frequency amplifier circuit 5, and numeral 11 denotes a pulse shaping circuit which shapes the pulsive noise detected by the pulsive noise detecting circuit 10, and it may comprise a monostable multivibrator. Numeral 9 denotes a signal holding circuit inserted between the detector circuit 6, the output circuit 7 and the pulse shaping circuit 11, and it comprises an emitter follower transistor 911 and a control transistor 912 therefor as shown in FIG. 2. A base of the transistor 911 is connected to an audio signal input terminal 91 through a resistors 921 and a capacitor 931, and also connected to a base bias voltage source 941 through a resistor 922. A collector of the transistor 911 is connected to a power supply terminal 22. An emitter thereof is connected to an audio signal output terminal 93 and also grounded through a parallel circuit of an emitter resistor 923 and a hold capacitor 932. A base of the control transistor 912 is connected to a control pulse signal input terminal 94 and is also grounded through a resistor 924, and an emitter thereof is directly grounded. The input terminal 91 is connected to an output terminal of the detector circuit 6, and the input terminal 94 is connected to an output terminal of the pulse shaping circuit 11. The output terminal 93 is connected to an input terminal of the output circuit.

In the above circuit configuration, a signal induced at the antenna 1 is fed through the radio frequency amplifier circuit 2, the mixer circuit 4 and the intermediate frequency amplifier circuit 5 to the detector circuit 6 where it is detected. A detected audio signal is supplied to the input terminal 91 of the signal holding circuit 9.

When the pulsive noise is absent, the transistor 911 is conductive and the audio signal supplied to the input terminal 91 is supplied to the hold capacitor 932 through the capacitor 931, the resistor 921 and the transistor 911.

If a time constant $T_1 \approx rC$ which is determined by a product of a magnitude r of an output resistance as looked from the emitter of the transistor 911 (i.e. an operational emitter resistance of the transistor 911) and a capacitance C of the hold capacitor 932 is selected to be sufficiently small, with respect to the cycle $(1/f)$ of the input signal applied at the input terminal 91, to reduce a charge time of the capacitor 932, the audio signal supplied to the input terminal 91 can be taken out of the output terminal 93 without distortion.

The audio signal derived at the output terminal 93 is fed through the output circuit 7 to the speaker 8 which generates sound.

When the pulsive noises are included in the received signal and an audio signal 61 on which the pulsive noises 62 and 63 as shown in FIG. 3(a) is supplied to the input terminal 91 of the signal holding circuit 9, the pulsive noises included in the received signal are detected by the pulsive noise detecting circuit 10, and the detected noises are shaped by the pulse shaping circuit 11. The resulting pulses are positive control pulses 111 and 112 which correspond in time to the pulsive noises 62 and 63 and have pulse width equal to or wider than the pulse width of the pulsive noises 62 and 63. The control pulses 111 and 112 are applied to the input terminal 94 of the signal holding circuit 9. The control pulses 111 and 112 applied to the input terminal 94 are then supplied to the base of the control transistor 912. When the control pulses 111 and 112 are supplied to the base of the transistor 912, the transistor 912 is forward biased into conduction by the control pulses. As the transistor 912 conducts, the base of the transistor 911 is grounded through the transistor 912 during the conduction period thereof so that the transistor 911 is rendered nonconductive. Namely, when the audio signal 61 on which the pulsive noises 62 and 63 are superimposed is applied to the input terminal 91, the transistor 911 is rendered nonconductive during the period of the superposition of the pulsive noises to prevent the pulsive noises 62 and 63 from appearing at the output terminal 93. When the transistor 911 is rendered nonconductive, the signal stored in the hold capacitor 932 is discharged through the resistor 923.

If a time constant $T_2 \approx RC$ which is determined by a product of a resistance R of the emitter resistor 923 of the transistor 911 and the capacitance C of the hold capacitor 932 is selected to be sufficiently large, with respect to the cycle $(1/f)$ of the input signal applied at the input terminal 91, to increase a discharge time of the hold capacitor 932, a level of the input signal can be held to a level at a moment immediately before the occurrence of the pulsive noises 62 and 63 as shown in FIG. 3(c) so that the pulsive noises 62 and 63 can be suppressed.

In the circuit configuration shown in FIG. 2, in order to reduce the charge time constant $T_1$ of the hold capacitor 923 and increase the discharge time constant $T_2$ so that the above operation is carried out satisfactorily, it is preferable to reduce the output resistor r of the transistor 911 and increase the emitter resistance R of the transistor 911. As is well known, the output resistance r of the transistor 911 is inversely proportional to an emitter current and is uniquely defined by the emitter current. In the circuit configuration of FIG. 2, the emitter current of the transistor 911 is determined by the resistance R of the emitter resistor 923 for a given base bias voltage of the bias voltage source 941 for the transistor 911, and a ratio r/R of the output resistance r to the emitter resistance R of the transistor 911 is constant. Accordingly, in order to reduce the output resistance r of the transistor 911, the voltage of the base bias voltage source 941 must be increased. There exists a restriction, however, in increasing the voltage of the base bias voltage source 941. Namely, in order to cause the transistor 911 to carry out a transistor operation, an input signal supplied to the base thereof must be always lower than the collector voltage of the transistor 911 (i.e. the voltage at the power supply terminal 92). Thus, in the circuit configuration of FIG. 2, it is difficult to have desired charge and discharge time constants for the hold capacitor 902 at the conduction and non-conduction of the transistor 911.

Further, in the circuit configuration of FIG. 2, when the control transistor 912 conducts, the transistor 911 shifts from a saturation region, to a cut-off region through a cut-off region where it operates as an emitter follower transistor. Accordingly, when the charge time constant of the hold capacitor 932, that is the time constant determined by the output resistance r looked from the emitter of the transistor 911 and the capacitance C of the hold capacitor 932 is reduced in accordance with the reason descrived above, the pulsive noises and the control pulses supplied to the base of the transistor 911 appear at the output terminal 93 during the active region operation of the transistor 911. FIG. 3(d) shows a waveform illustrating the appearance of such sprious noises.

Figure 4:
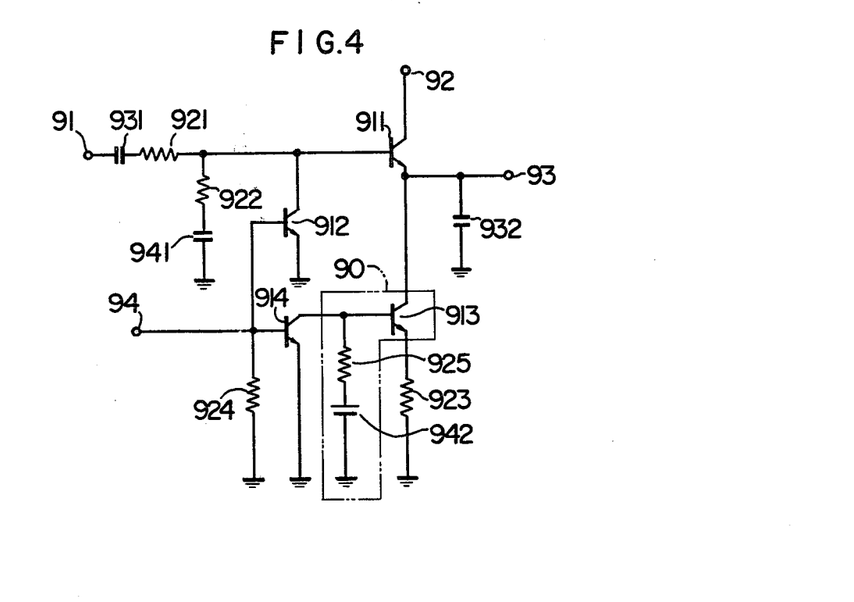
FIG. 4 shows a circuit diagram illustrating one embodiment of the signal holding circuit of the present invention.

FIG. 4 shows a circuit diagram of one embodiment of the present invention which overcomes the above difficulty. In FIG. 4, the like parts to those of FIG. 1 are designated by like numerals. In the improved circuit of FIG. 4, numeral 90 denotes a constant current source circuit, and 913 denotes a constant current source transistor which is conductive during normal reception of the signal. A collector of the transistor 913 is directly connected to the emitter of the emitter follower transistor 911. An emitter of the transistor 913 is grounded through an emitter resistor 923, and a base thereof is connected to a base bias voltage source 942 through a resistor 925. Numeral 914 denotes a control transistor which is non-conductive during normal reception of the signal and rendered conductive when the pulse control signals 62 and 63 are applied to the control signal input terminal 94, to cut off the transistor 913. A base of the control transistor 914 is connected to the input terminal 94 and also grounded through the resistor 924. A collector of the transistor 914 is directly connected to the base of the transistor 913 and an emitter of the transistor 914 is directly grounded.

In the circuit configuration described above, an audio signal applied to the input terminal 91 is supplied to the hold capacitor 932 through the capacitor 931, the resistor 921 and the base-emitter of the transistor 911, like in the case of FIG. 2 described before.

An emitter current of the transistor 911, that is, a constant current $I_o$ of the constant current source circuit 90 is selected to be large enough to cause a charge stored in the hold capacitor 932 during a positive half period of the audio signal to discharge in a period shorter than a negative half period. An output resistance of the signal holding circuit, that is, an output resistance looked from the output terminal 93 into the transistor 911 is equal to an emitter operational resistance $r_e$ of the transistor 911. The resistance $r_e$ is very small and generally given by;

$$r_e = (kT/qI_o) = 26[\Omega/mA]$$

where
k: Bolzman's constant
q: charge of electron
T: absolute temperature

Accordingly, a charge time constant $T_1 = r_e C$ of the hold capacitor can be selected to be small so that the input audio signal applied at the input terminal 91 can be demodulated at the output terminal 93 with high fidelity or without distortion of the input audio signal.

When the pulsive noises are superimposed on the audio signal supplied to the input terminal 91 and the positive control pulses which correspond in time to the pulsive noises and have the same pulse width as that of the pulsive noises are supplied to the input terminal 94, the control transistors 912 and 914 are both forward biased into conduction by the control pulses. As the transistors 912 and 914 conduct, the emitter follower transistor 911 and the constant current source transistor 913 are cut off because the bases thereof are grounded through the transistors 912 and 914. As the transistor 913 is cut off, the discharge path of the charge stored in the hold capacitor 932 to ground through the transistor 913 and the resistor 923 is disconnected.

Accordingly, by properly, selecting the resistance of the load connected to the output terminal 93, the discharge time constant of the hold capacitor 932 can be selected to be large and yet to a desired value. Thus, the signal hold time can be increased so that the circuit can fully suppress the pulsive noises having wide pulse width.

Figure 5:
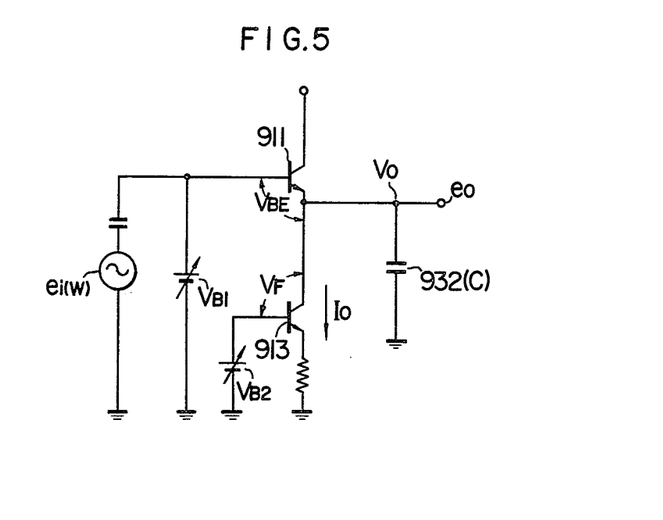
FIGS. 5 and 7 shows simplified diagrams for explaining the operation of the circuit of FIG. 4.

Referring now to FIGS. 5 to 8, the reason why the control pulses do not appear at the output terminal 93 during the suppression operation for the pulsive noises is explained. FIG. 5 shows a simplified diagram of FIG. 4. In FIG. 5, an emitter D.C. voltage (output D.C. voltage) $V_o$ of the emitter follower transistor 911 changes in proportion to a voltage of the control voltage source $V_{B1}$ of the transistor 911 and a voltage of the control voltage source $V_{B2}$ of the transistor 913.

When the voltage of the control voltage source $V_{B1}$ is set to be equal to;

$$V_{B1} = V_{B2} - V_F + V_{BE}$$

where $V_F$: base-collector junction voltage of the transistor 913
$V_{BE}$: base-emitter junction voltage of the transistor 911 and the transistor 913 is operated in saturation condition, the emitter D.C. voltage $V_o$ of the transistor 911 is fixed to;

$$V_o = V_{B2} - V_F$$

Figure 6:
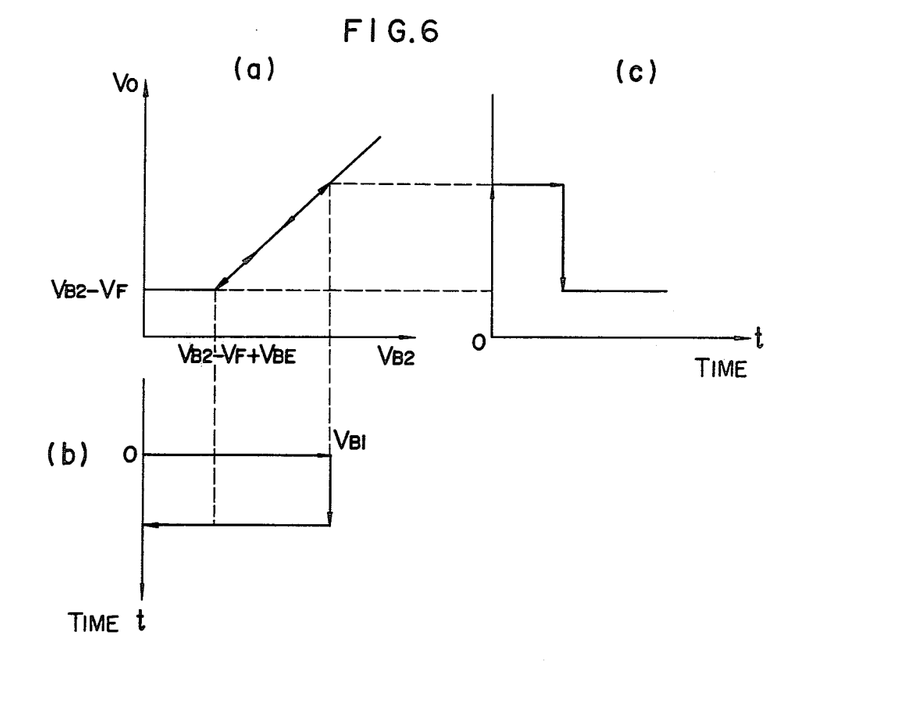
FIGS. 6 and 8 show characteristic curves for explaining the operation of the circuit of FIG. 4.

FIG. 6(a) shows a characteristic curve illustrating a change of the emitter D.C. voltage $V_o$ of the transistor 911 to the voltage of the control voltage source $V_{B2}$.

In the circuit of FIG. 5 above, when the control voltage $V_{B1}$ is changed pulsively as shown in FIG. 6(b), the emitter D.C. voltage $V_o$ changes stepwise as shown in FIG. 6(c). Namely, the cnage of the control voltage $V_{B1}$ appears at the emitter of the transistor 911.

Figure 7:
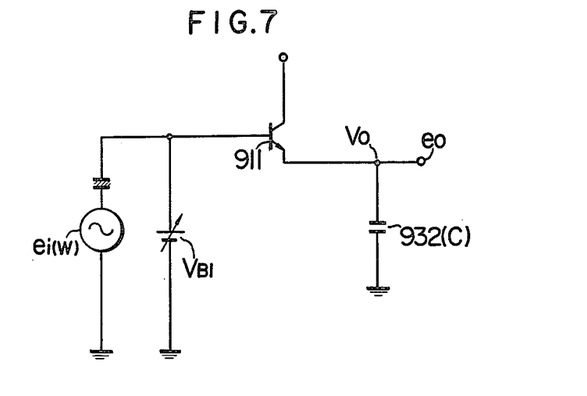

According to the present invention, the circuit is designed such that the constant current source transistor 913 is cut off at the moment of the appearance of the change of the control voltage $V_{B1}$ at the emitter of the transistor 911 so that the emitter of the transistor 911 floats D.C.-wise as shown in FIG. 7. In the circuit of FIG. 7, when the control voltage $V_{B1}$ is pulsively changed, the emitter D.C. voltage $V_o$ of the transistor 911 assumes the charge voltage of the hold capacitor 932, i.e., $V_o = V_{B1} - V_{BE}$, assuming that an initial voltage of the hold capacitor 932 is equal to zero volt. During the fall time of the pulse, the base voltage of the transistor 911 satisfies the relation;

$$V_o + V_{BE} > V_{B1}$$

and hence the transistor 911 is momentarily cut off. As a result, the discharge path for the charge of the hold capacitor 932 is disconnected, and the hold capacitor 932 holds the voltage which appeared immediately before the fall of the pulse.

Figures 8, 9:
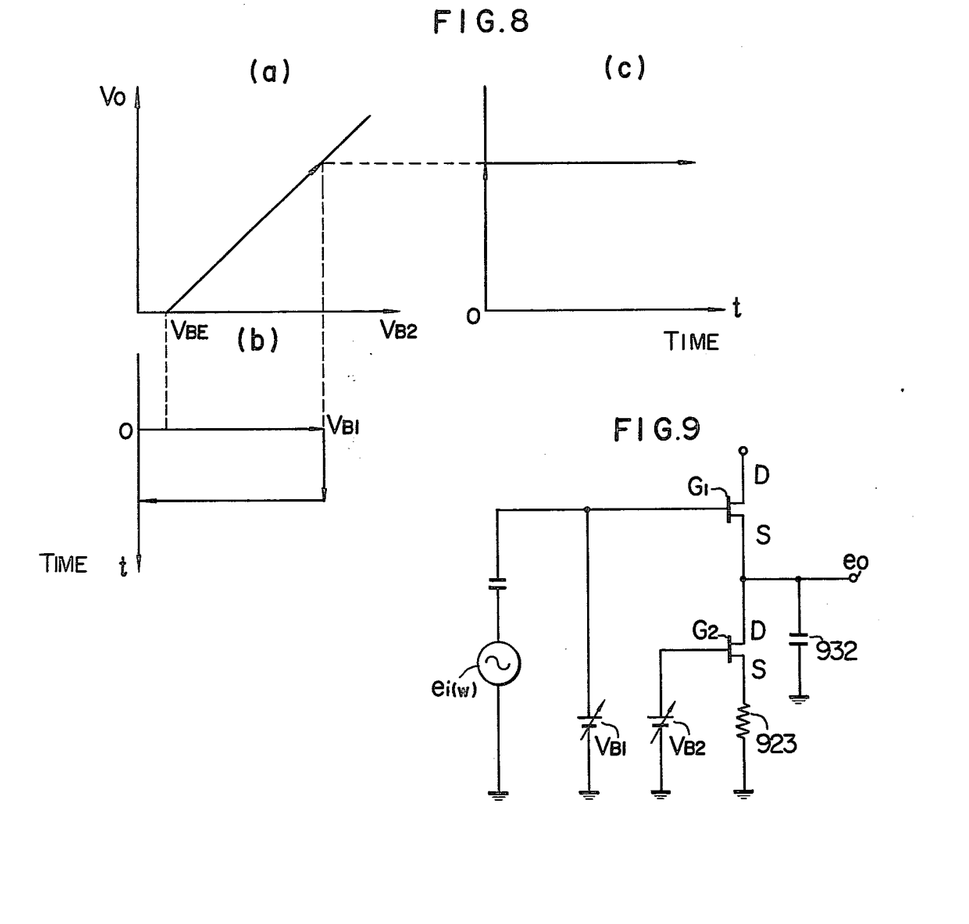
FIG. 9 shows a simplified circuit diagram illustrating another embodiment of the signal holding circuit of the present invention.

FIG. 8 shows a characteristic curve illustrating a change of the emitter D.C. voltage $V_o$ of the transistor 911 to the control voltage $V_{B1}$. It is seen from the characteristic curve of FIG. 8 that the D.C. voltage $V_o$ is kept constant for the change of the control voltage $V_{B1}$.

Thus, the circuit of the present invention is characterized by that it operates as the circuit shown in FIG. 5 during normal reception of the signal, i.e. when no pulsive noise is superimposed on the audio signal and operates as the circuit shown in FIG. 7 when the pulsive noises are superimposed on the audio signal.

While it has been explained in the above embodiment that the transistor 913 is completely cut off during the occurrence of the pulsive noise, the transistor 913 need not be completely cut off because slight discharge of the hold capacitor 932 raises no problem so far as the effect of the suppression of the pulsive noise is fully attained. Further, the base potential of the transistor 911 need not be absolutely equal to ground potential but it is sufficient that it is below the charge voltage of the hold capacitor 932.

A similar effect can be attained when the transistors 911 and 913 are replaced by FET transistors as shown in FIG. 9.

Figure 10:
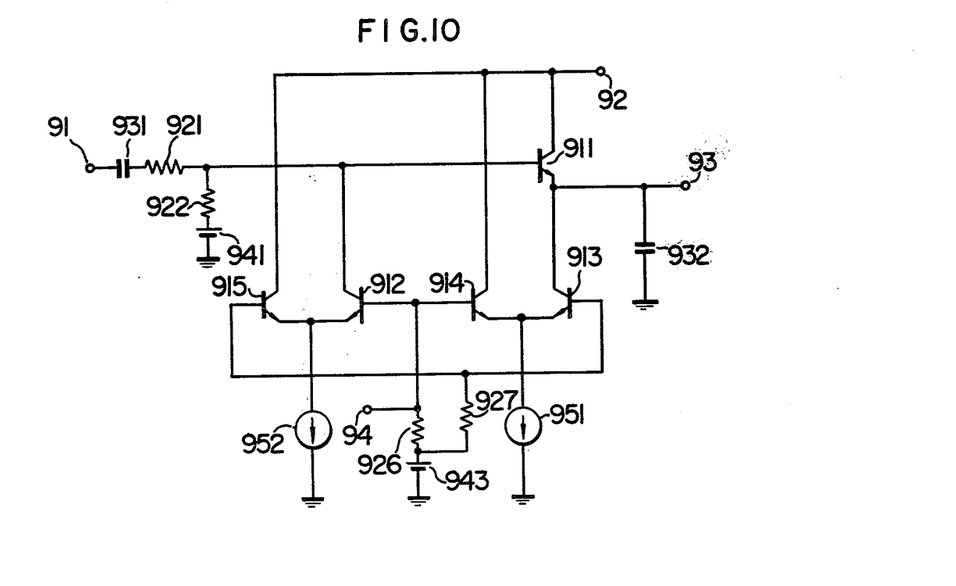
FIG. 10 shows a circuit diagram of a further embodiment of the signal holding circuit of the present invention.

FIG. 10 shows a circuit diagram of another embodiment of the present invention, in which the transistors 913 and 914 shown in FIG. 4 are connected differentially. In FIG. 10, common emitters of the differential pair of transistor 913 and 914 are connected to a constant current circuit 951. The collector of the transistor 913 is connected to the emitter of the transistor 911, and the collector of the transistor 914 is connected to the power supply terminal 92. The common emitters of the differential pair of transistors 912 and 915 are grounded through a constant current circuit 952. The collector of the transistor 912 is connected to the base of the transistor 911, and the collector of the transistor 915 is connected to the power supply terminal 92. The bases of the transistor 913 and 915 are connected in common and biased from the base bias voltage source 943 through a resistor 927, and the bases of the transistors 912 and 914 are grounded through a resistor 926 and the base bias voltage source 943, and also connected to the control pulse input terminal 94. The remaining portions of the circuit are identical to those of FIG. 4 and hence they are not explained here.

In the circuit configuration of FIG. 10, the transistors 911, 913 and 915 are conductive while the transistors 912 and 914 are nonconductive during normal reception of the signal.

When noises are included and the control pulses are applied to the input terminal 94, the transistors 914 and 912 are forward biased into conduction by the control pulses and the transistors 913 and 915 are cut off. As the transistor 912 conducts, the base of the transistor 911 is grounded through the transistor 912 and the constant current circuit 952 so that the transistor 911 is cut off. As the transistor 911 is cut off, the signal supplied to the hold capacitor 932 tends to discharge through the transistor 913. However, since the transistor 913 is nonconductive at this time and hence the internal resistance thereof is very high, the discharge time constant of the hold capacitor 932 is very large.

In this manner, similar operation and effect to those of the previous embodiment can be attained.

While the hold capacitor 932 is connected between the emitter of the transistor 911 and ground in the above embodiment, it should be understood that a similar effect may be attained when the hold capacitor 932 is connected between the emitter of the transistor 911 and A.C.-wise ground.

In the embodiments descrived above, the signal holding circuit of the present invention is utilized the pulse suppression circuit. The signal holding circuit of the present invention can also be utilized as a muting circuit.

Figure 11:
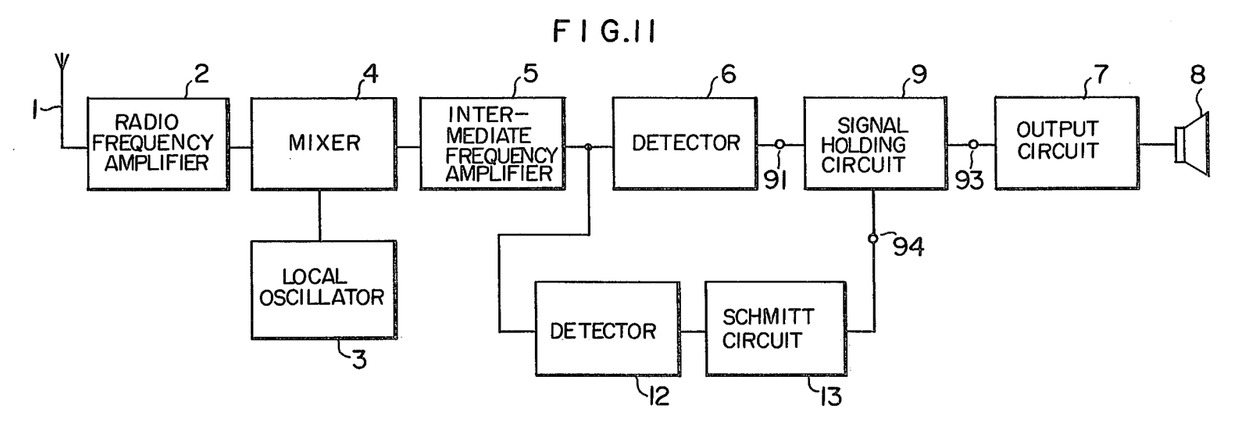
FIG. 11 shows a block diagram illustrating an embodiment in which the signal holding circuit is used as a muting circuit.

FIG. 11 shows an embodiment in which the signal holding circuit of the present invention is used as the muting circuit. In FIG. 11, numeral 12 denotes a detector circuit which senses the intermediate frequency signal from the intermediate frequency amplifier 5 and detects the sensed signal, and numeral 13 denotes a Schmitt circuit which renders the emitter follower transistor 911 (see FIG. 4) of the signal holding circuit 9 when the detected output signal from the detector circuit 12 falls below a predetermined level, that is, during the absence of signal and the presence of weak input electrical field, to inhibit the transmission of the audio signal from the detector circuit 6 to the output circuit 7, and render the transistor 911 conductive during the remaining time period, to conduct the audio signal to the output circuit 7.

According to the signal holding circuit of the present invention, the rapid change of the D.C. voltage at the input stage of the output circuit 7 at the moment of the cutoff of the signal holding circuit 9 can be suppressed by the function of the hold capacitor 932, and the occurrence of the shock noise due to the rapid change of the D.C. voltage can be prevented.

I claim:

1. A signal holding circuit comprising:
   an audio signal input terminal;
   an audio signal output terminal;
   an emitter follower transistor for introducing an audio signal supplied to said input terminal to said output terminal;
   a constant current source transistor connected to an emitter of said emitter follower transistor for defining an emitter current thereof;
   a control signal input terminal for receiving a control signal;
   control circuit means connected between said control signal input terminal and the base of said emitter follower transistor and said constant current source transistor, and operative to substantially cut off said emitter follower transistor and substantially cut off said constant current source transistor when a control signal is applied to said control signal input terminal; and
   a hold capacitor connected in parallel with said constant current source transistor, said audio signal being supplied to said hold capacitor when said emitter follower transistor is conducting, said hold capacitor functioning to hold an output level at the emitter of said emitter follower transistor to a level at a moment immediately before the cut off of said emitter follower transistor in accordance with the supplied audio signal when said emitter follower transistor is cut off.

2. A signal holding circuit according to claim 1, wherein said control circuit means includes a first control transistor which is rendered conductive by the control signal applied to said control signal input terminal to ground a base of said emitter follower transistor substantially cut off the emitter follower transistor, and a second control transistor which is rendered conductive by the control signal applied to said control signal input terminal to substantially cut off said constant current source transistor.

3. A signal holding circuit according to claim 1, wherein said constant current source circuit includes a constant current source transistor which is normally conductive and rendered nonconductive or substantially nonconductive when the control signal is applied to said control signal input terminal to float the emitter of said emitter follower transistor.

4. A signal holding circuit comprising:
an audio signal input terminal;
an audio signal output terminal;
an emitter follower transistor for introducing an audio signal supplied to said input terminal to said output terminal;
a constant current source transistor connected to an emitter of said emitter follower transistor for defining an emitter current thereof;
a control pulse input terminal for receiving a control pulse when a pulsive noise is superimposed on said audio signal, said control pulse corresponding in time to said pulsive noise and having a pulse width equal to or wider than a pulse width of said pulsive noise;
a first control transistor adapted to be forward biased into conduction by said control pulse supplied to said control pulse input terminal to ground a base of said emitter follower transistor to substantially cut off said emitter follower transistor,
a second control transistor adapted to be forward biased into conduction by the control pulse supplied to said control pulse input terminal to ground a base of said constant current source transistor to substantially cut off said constant current source transistor; and
a hold capacitor connected between the emitter of said emitter follower transistor and A.C.-wise ground, said audio signal being supplied to said hold capacitor when said emitter follower transistor is conductive, said hold capacitor functioning to hold an output level at the emitter of said emitter follower transistor to a level at a movement immediately before the cutoff of said emitter follower transistor in accordance with said audio signal supplied to said hold capacitor when said emitter follower transistor is cut off.

5. A signal holding circuit according to claim 4, wherein said emitter follower transistor and said constant current source transistor are composed of FET transistors.

6. A signal holding circuit comprising:
an audio signal input terminal;
an audio signal output terminal;
an emitter follower transistor for introducing an audio signal supplied to said input terminal to said output terminal;
a constant current source transistor connected to an emitter of said emitter follower transistor for defining an emitter current thereof;
a control D.C. signal input terminal for receiving a control D.C. signal;
a first control transistor adapted to be forward biased into conduction by the control D.C. signal supplied to said control D.C. signal input terminal to ground a base of said emitter follower transistor to substantially cut off said emitter follower transistor;
a second control transistor adapted to be forward biased into conduction by the control D.C. signal supplied to said control D.C. signal input terminal to ground a base of said constant current source transistor to substantially cut off said constant current source transistor; and a hold capacitor connected between said emitter of said emitter follower transistor and A.C.-wise ground, said audio signal being supplied to said hold capacitor when said emitter follower transistor is conductive, said hold capacitor functioning to hold an output level at the emitter of said emitter follower transistor to a level at a moment immediately before the cut off of said emitter follower transistor in accordance with the audio signal supplied to said hold capacitor when said emitter follower transistor is cut off.

7. A signal holding circuit comprising:
a transistor of the type which includes a collecting electrode, an emitting electrode, and a control electrode and in which the conductivity between said collecting electrode and said emitting electrode is controlled by an input signal applied to said control electrode, and an output is produced from said emitting electrode;
biasing means connected to said control electrode of said transistor to apply a bias potential to said transistor to keep said transistor normally conductive;
a hold capacitor connected to said emitting electrode of said transistor;
impedance circuit means connected to constitute a parallel discharge circuit to said hold capacitor and normally assuming a low impedance; and
control circuit means responsive to the application of a control pulse which sustains for a predetermined period during which the input signal is to be blocked to change the bias potential applied to said transistor by said biasing means to a potential to substantially cut off said transistor and cause said impedance circuit means to assume a high impedance during the sustained period of said control pulse.

8. A signal holding circuit according to claim 7, wherein said impedance circuit means comprises a series circuit of a constant current source transistor which is biased to be normally conductive and a resistor, and said control circuit means comprises first and second control transistors adapted to receive said control pulse to conduct during the duration of said control pulse, said first control transistor being connected to said constant current source transistor such that when said, first control transistor conducts, it grounds the control electrode of said transistor, and said second control transistor being connected to said constant current source transistor such that when said second control transistor conducts, it cuts off said constant current source transistor.

9. A signal holding circuit according to claim 8, wherein said constant current source transistor comprises a bipolar transistor having a base biased to a potential sufficient to render said transistor conductive, and said second control transistor is connected to said constant current source transistor such that when said second control transistor conducts, it grounds the base of said constant current source transistor.

10. A signal holding circuit according to claim 7, wherein said impedance circuit means comprises a constant current source transistor having collector thereof connected to the emitting electrode of said transistor and a first current source connected to an emitter of said first constant current source transistor, and said control circuit means comprises a first control transistor having collector thereof connected to the control electrode of said transistor and base thereof adapted to receive said control pulse to render said first control transistor conductive during the duration of said control pulse, a second control transistor having base thereof adapted to receive said control pulse to render said second control transistor conductive during the duration of said control pulse and emitter thereof connected in common to the emitter of said constant current transistor, a third control transistor having emitter thereof connected in common to the emitter of said first control transistor, collector thereof connected to an operation voltage supply and base thereof connected in common to the base of said constant current source transistor, control biasing means for supplying a bias potential in common to the bases of said second and third control transistors to normally maintain said second and third control transistors conductive, and a second constant current source connected to the commonly connected emitters of said first and third control transistors, whereby said constant current source transistor and said third transistor conduct when said control pulse is absent and said second and third control transistors conduct when said control pulse is present.

11. A signal holding circuit according to claim 8, comprising means for generating a control pulse having a pulse duration of a noise pulse included in the input signal, wherein said first and second control transistors are adapted to receive said control pulse.

12. A signal holding circuit according to one of claims 7, 8, 9, 10, or 11, wherein said transistor is a bipolar transistor.

13. A signal holding circuit according to one of claims 7, 8, 9, 10, or 11, wherein said transistor is a field effect transistor.

14. A signal holding circuit comprising:
a transistor of the type which includes a collecting electrode, an emitting electrode, and a control electrode and in which the conductivity between said collecting electrode and said emitting electrode is controlled by an input signal applied to said control electrode, and an output is produced from said emitting electrode;
biasing means connected to the control electrode of said transistor to apply a bias potential to said transistor to keep said transistor normally conductive;
a hold capacitor connected between said emitting electrode of said transistor and A.C.-wise ground;
a constant current current source transistor connected to said emitting electrode of said transistor for defining an emitting electrode current thereof;
control circuit means responsive to the application of a control signal which sustains for a predetermined period during which the input signal is to be blocked to change the bias potential of said transistor to a potential to substantially cut off said transistor and cause said constant current transistor to substantially cut off during the sustained period of said control signal.

15. A signal holding circuit according to claim 14, wherein said control circuit means comprises:
a first control transistor adapted to be forward biased into conduction by the control signal to ground a base of said transistor to substantially cut off said transistor;
a second control transistor adapted to be forward biased into conduction by the control signal to ground a base of said constant current source transistor to substantially cut off said constant current source transistor;
said input signal being supplied to said hold capacitor when said transistor is conductive, said hold capacitor functioning to hold an output level at the emitting electrode of said transistor to a level at a moment immediately before the cut off of said transistor in accordance with the input signal supplied to said hold capacitor when said transistor is cut off.

16. A signal holding circuit comprising:
an emitter follower transistor of the type which includes a collector electrode, an emitter electrode, and a base electrode and in which the conductivity between said collector electrode and said emitter electrode is controlled by an input signal applied to said base electrode, and an output is produced from said emitter electrode;
a constant current source transistor connected to an emitter electrode of said emitter follower transistor for defining an emitter current thereof;
a control signal input terminal for receiving a control signal;
a first control transistor adapted to be forward biased into conduction by the control signal supplied to said control signal input terminal to ground a base of said emitter follower transistor to substantially cut off said emitter follower transistor;
second control transistor adapted to be forward biased into conduction by the control signal supplied to said control signal input terminal to ground a base electrode of said constant current source transistor to substantially cut off said constant current source transistor; and
a hold capacitor connected between said emitter electrode of said emitter follower transistor and A.C.-wise ground, said input signal being supplied to said hold capacitor when said emitter follower transistor is conductive, said hold capacitor functioning to hold an output level at the emitter electrode of said emitter follower transistor to a level at a moment immediately before the cut off of said emitter follower transistor in accordance with the input signal supplied to said hold capacitor when said emitter follower transistor is cut off.

* * * * *